(12) United States Patent
Soh et al.

(10) Patent No.: US 8,680,474 B2
(45) Date of Patent: Mar. 25, 2014

(54) PARALLEL READOUT INTEGRATED CIRCUIT ARCHITECTURE FOR X-RAY IMAGE SENSOR

(75) Inventors: Myung-Jin Soh, Langley (CA); Seul-Yi Soh, Langley (CA)

(73) Assignee: Luxen Technologies, Inc., Seoul (KR)

( * ) Notice: Subject to any disclaimer, the term of this patent is extended or adjusted under 35 U.S.C. 154(b) by 112 days.

(21) Appl. No.: 13/410,320

(22) Filed: Mar. 2, 2012

(65) Prior Publication Data

US 2013/0228693 A1 Sep. 5, 2013

(51) Int. Cl.
*H01L 27/146* (2006.01)

(52) U.S. Cl.
USPC .................................. 250/370.09

(58) Field of Classification Search
USPC ................ 250/370.01–370.15; 378/98.8
See application file for complete search history.

(56) References Cited

U.S. PATENT DOCUMENTS

| | | | |
|---|---|---|---|
| 6,180,946 B1 * | 1/2001 | Ebstein | 250/370.11 |
| 7,634,061 B1 * | 12/2009 | Tumer et al. | 378/98.9 |
| 7,863,578 B2 * | 1/2011 | Brenner et al. | 250/389 |
| 2005/0224903 A1 * | 10/2005 | Augusto et al. | 257/440 |
| 2008/0128631 A1 * | 6/2008 | Suhami | 250/370.09 |
| 2009/0152471 A1 * | 6/2009 | Rousso et al. | 250/363.04 |
| 2010/0051823 A1 * | 3/2010 | Brenner et al. | 250/389 |
| 2010/0116999 A1 * | 5/2010 | Tumer et al. | 250/370.13 |
| 2010/0127160 A1 * | 5/2010 | Niclass et al. | 250/214 DC |
| 2010/0219345 A1 * | 9/2010 | Franch et al. | 250/362 |
| 2010/0245354 A1 * | 9/2010 | Rousso et al. | 345/424 |
| 2010/0245809 A1 * | 9/2010 | Andreou et al. | 356/222 |
| 2012/0112088 A1 * | 5/2012 | Abraham | 250/395 |
| 2012/0298877 A1 * | 11/2012 | Dinapoli et al. | 250/370.01 |

* cited by examiner

*Primary Examiner* — Kiho Kim
(74) *Attorney, Agent, or Firm* — Maxine L. Barasch; Keohane & D'Alessandro, PLLC

(57) ABSTRACT

Embodiments of the present invention provide a computer-implemented method for parallel readout for an X-ray image sensor module having a pixel array. Specifically, among other things, embodiments of the present invention provide a computer-implemented infrastructure comprising: capturing an electrical signal at each of a plurality of pixels within the pixel array; converting each of the captured electrical signals into a respective voltage; comparing each of the respective voltages with a reference voltage to discriminate whether the electric signal from the sensor represents a photon detection; counting a photon detection for each of the plurality of pixels within the pixel array based upon an output of the comparator; connecting all pixels in each of the columns; and sequentially selecting said rows of pixels for readout over the column bus lines at a sensor output.

18 Claims, 5 Drawing Sheets

PARALLEL READOUT INTEGRATED CIRCUIT ARCHITECTURE FOR X-RAY IMAGE SENSOR

FIELD OF THE INVENTION

The present invention relates to X-ray image sensors. More specifically, the present invention is related to a parallel readout integrated circuit architecture for an X-ray image sensor.

BACKGROUND OF THE INVENTION

The discovery of X-rays in 1895 was the beginning of a revolutionary change in our understanding of the physical world.

In the winter of the year of his fiftieth birthday, and the year following his appointment to the leadership of the University of Würzburg, Rector Wilhelm Conrad Roentgen noticed a barium platinocyanide screen fluorescing in his laboratory as he generated cathode rays in a Crookes tube some distance away. Leaving aside for a time his duties to the university and to his students, Rector Roentgen spent the next six weeks in his laboratory working alone and sharing nothing with his colleagues.

Three days before Christmas he brought his wife into his laboratory, and they emerged with a photograph of the bones in her hand and of the ring on her finger. The Würzburg Physico-Medical Society was the first to hear of the new rays that could penetrate the body and photograph its bones. Roentgen delivered the news on Dec. 28, 1895.

Emil Warburg relayed it to the Berlin Physical Society on Jan. 4, 1896. The next day the Wiener Press carried the news, and the day following, word of Roentgen's discovery began to spread by telegraph around the world.

Roentgen was well aware of the enormous help this technology could offer in diagnosing and treating previously undetectable internal ailments. Within a year after he published his findings, X-ray photographs were being used to assist doctors performing surgery and on the battlefield to locate bullets in the bodies of wounded soldiers. The impact of X-rays on the medical field has only increased since then with the development of fluoroscopy, angiography, and tomography.

X-rays are basically the same thing as visible light rays. Both are wavelike forms of electromagnetic energy carried by particles called photons. The difference between X-rays and visible light rays is the energy level of the individual photons. This is also expressed as the wavelength of the rays.

In general, X-rays have a short wavelength and may easily penetrate through a subject. Amounts of penetrating X-rays are affected by the density of an area of the subject. That is, an area of the subject may be indirectly observed due to the amounts of X-rays penetrating the subject. X-ray image sensors detect the amounts of X-rays penetrating the subject. The X-ray sensors detect the amounts of penetrated X-rays and may display a form of an area of the subject on a display device. X-ray sensors may be generally used in examination apparatuses such as a medical examination apparatus.

Today, digital X-ray imaging devices are rapidly replacing photographic film-based X-ray imaging devices in medical applications (e.g., dental applications and mammography). In addition to the inherent advantages associated with digital imaging, digital X-ray imaging devices can have the added benefit of being able to reduce the radiation dose received by a patient.

However, there is no parallel readout for an X-ray image sensor module having a pixel array. Heretofore, several unsuccessful attempts have been made to address these shortcomings.

U.S. Pat. No. 8,039,811 discloses a CMOS time delay integration sensor for X-ray imaging applications.

U.S. Patent Application 20090168966 discloses a medical digital X-ray imaging apparatus and medical digital X-ray sensor.

U.S. Patent Application 20030035510 discloses a sensor arrangement and method in digital X-ray imaging.

U.S. Patent Application 20090108207 discloses a CMOS sensor adapted for dental X-ray imaging.

U.S. Patent Application 20100171038 discloses a sensor unit for an X-ray detector and associated production method.

U.S. Patent Application 20100102241 discloses a system and method for automatic detection of X-rays at an X-ray sensor.

None of these references, however, teach parallel readout for an X-ray image sensor module having a pixel array.

SUMMARY OF THE INVENTION

In general, embodiments of the present invention provide a computer-implemented method for parallel readout for an X-ray image sensor architecture having a pixel array. Specifically, among other things, embodiments of the present invention provide a computer-implemented infrastructure comprising: capturing an electrical signal at each of a plurality of pixels within the pixel array; converting each of the captured electrical signals into a respective voltage; comparing each of the respective voltages with a reference voltage to discriminate whether the electric signal from the sensor represents a photon detection; counting a photon detection for each of the plurality of pixels within the pixel array based upon an output of the comparator; connecting all pixels in each of the columns; and sequentially selecting said rows of pixels for readout over the column bus lines at a sensor output.

In one embodiment, there is a photon counting image sensor module configured to perform parallel mode readout of a pixel array, comprising: a two-dimensional pixel array, wherein each pixel within the pixel array comprises a sensor configured to capture an electrical signal; an amplifier configured to convert the electrical signal into a voltage; a comparator configured to compare the voltage derived from the electric signal with a reference voltage to discriminate whether the electric signal from the sensor represents a photon detection; and a counter configured to count a photon detection for each respective pixel within the pixel array based upon an output of the comparator; a plurality of column bus lines respectively connecting all pixels in each of the columns; a vertical shift register having a plurality of parallel outputs for sequentially selecting said rows of pixels for readout over the column bus lines at a sensor output; and a column output bus line for transmitting a pixel data of a first pixel to an adjacent second pixel.

In a second embodiment, there is a computer-implemented method for parallel mode readout for an X-ray image sensor module having a pixel array, comprising: capturing an electrical signal at each of a plurality of pixels within the pixel array; converting each of the captured electrical signals into a respective voltage; comparing each of the respective voltages with a reference voltage to discriminate whether the electric signal from the sensor represents a photon detection; counting a photon detection for each of the plurality of pixels within the pixel array based upon an output of the comparator; connecting all pixels in each of the columns; sequentially selecting said rows of pixels for readout over the column bus lines at a sensor output; and transmitting a pixel data of a first pixel to an adjacent second pixel via a column output bus line.

In a third embodiment, there is a computer-readable storage device storing computer instructions which, when executed, enables a computer system to perform parallel mode readout for an X-ray image sensor module having a pixel array, the computer instructions comprising: capturing an electrical signal at each of a plurality of pixels within the pixel array; converting each of the captured electrical signals into a respective voltage; comparing each of the respective voltages with a reference voltage to discriminate whether the electric signal from the sensor represents a photon detection; counting a photon detection for each of the plurality of pixels within the pixel array based upon an output of the comparator; connecting all pixels in each of the columns; sequentially selecting said rows of pixels for readout over the column bus lines at a sensor output; and transmitting a pixel data of a first pixel to an adjacent second pixel via a column output bus line.

Embodiments of the present invention provide a computer-implemented method for parallel readout for an X-ray image sensor module having a pixel array. Specifically, among other things, embodiments of the present invention provide a computer-implemented infrastructure comprising: capturing an electrical signal at each of a plurality of pixels within the pixel array; converting each of the captured electrical signals into a respective voltage; comparing each of the respective voltages with a reference voltage to discriminate whether the electric signal from the sensor represents a photon detection; counting a photon detection for each of the plurality of pixels within the pixel array based upon an output of the comparator; connecting all pixels in each of the columns; and sequentially selecting said rows of pixels for readout over the column bus lines at a sensor output.

Figure 1:
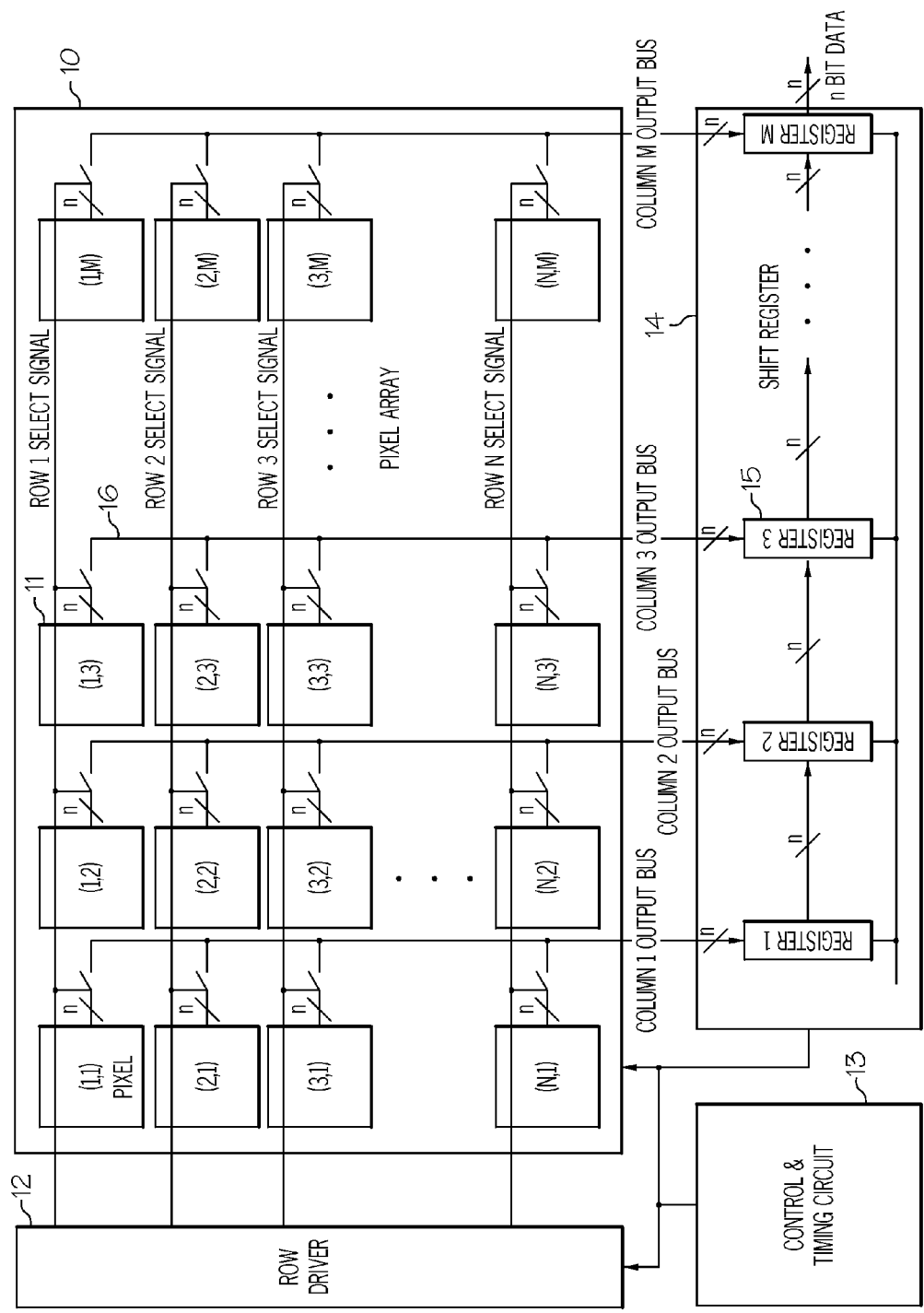
FIG. 1 shows a high-level schematic diagram showing a readout integrated circuit (ROIC) component of an X-ray image module.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Illustrative embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or rectify "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention provide a computer-implemented method for parallel readout for an X-ray image sensor module having a pixel array. Specifically, among other things, embodiments of the present invention provide a computer-implemented infrastructure comprising: generating a pixel data for each pixel within a respective pixel row of the pixel array based on a photon count; receiving a first serial pixel data, wherein the first serial pixel data comprises pixel data from a plurality of pixels of a first column; receiving a second serial pixel data, wherein the second serial pixel data comprises pixel data from a plurality of pixels of a second column; and shifting the first serial pixel data from the first column register to the second column register.

One of the key innovative aspects in X-ray imaging is the energy-resolved counting of the photons which are let through or transmitted by the object being analyzed when being exposed to X-ray radiation. Depending on the number and energy the transmitted photons have, it can be concluded, after a slice image reconstruction step, through which types of material the X-ray beams have traveled. In particular, this allows for the identification of different parts, tissues, and materials within a human body.

Referring now to FIG. 1, a photon counting X-ray image sensor module is depicted which may include a two-dimensional pixel array 10 including any number of rows and columns of single pixels 11, a row driver 12, a control and timing circuit 13, a shift register 14 including register 15, and a column output bus line 16. In some examples, the shift register 14 may include any number of registers. In some examples, any number of column output bus lines may be used.

Figure 2:
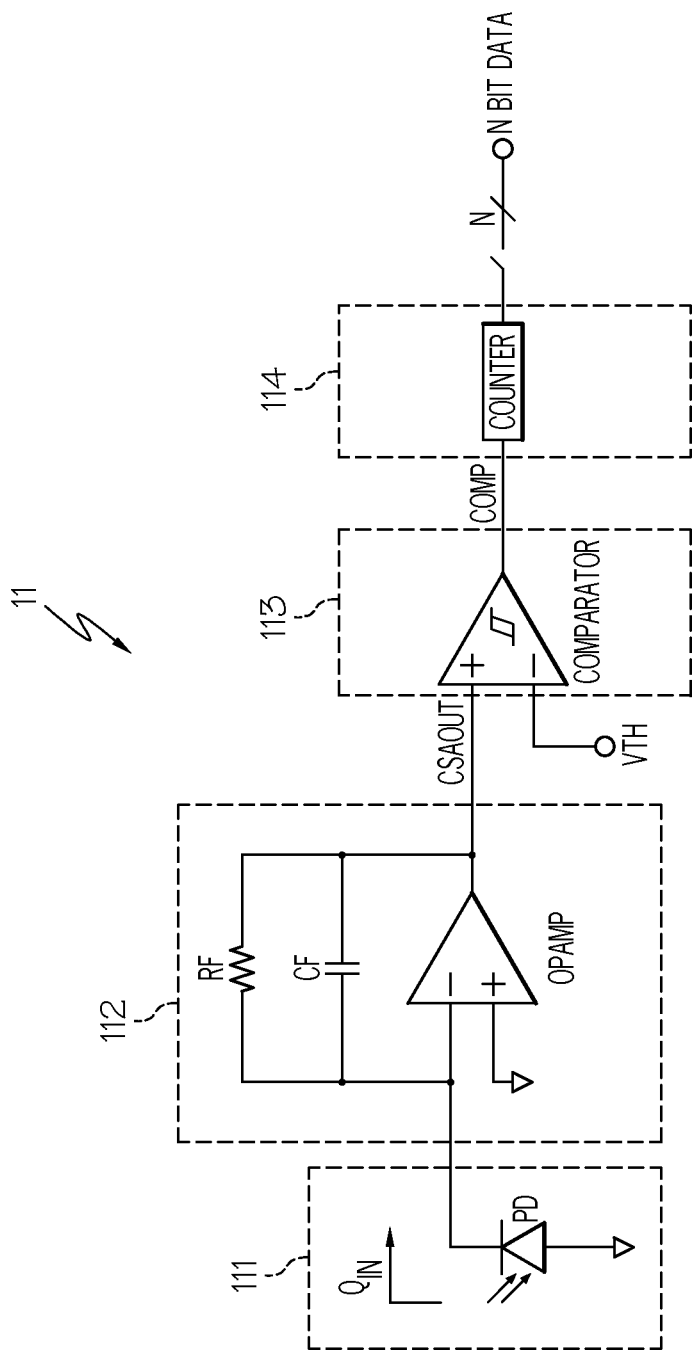
FIG. 2 shows a more detailed view of a single pixel shown in FIG. 1.

FIG. 2 depicts an example single pixel 11. Each single pixel 11 may include a sensor 111, an operational amplifier 112, a comparator 113, and a counter 114.

The sensor 111 receives optical signals and outputs electric pulses corresponding to the received optical signals. For example, the sensor 111 detects photons and generates respective pulse currents corresponding to the detected photons. Such a sensor 111 may be implemented using a photodiode (PD) that generates current in response to light, for example. A photodiode is a type of photodetector capable of converting light into either current or voltage, depending upon the mode of operation. The sensor 111 may be a digital charge-coupled device (CCD) or complementary metal-oxide-semiconductor (CMOS), and the incident light could include light of different wavelengths, including X-ray photons, as only an example. Additionally, the sensor 111 may include plural photon detectors, such as respectively detecting photons for different sensors.

The operational amplifier 112 may be used to convert the small output current of a photodiode transducer to a fast responding voltage. In one example, an operational amplifier 112 (OPAMP) may be used to convert the electrical pulses into a voltage (shown in FIG. 2 as current sense amplifier output or CSAOUT). An operational amplifier (OPAMP) is a DC-coupled high-gain electronic voltage amplifier with a differential input and, usually, a single-ended output.

When X-rays strike the photodiode 111, signal charge pulses ($Q_{IN}$) are generated, with amplitude according to the particle energy. Due to this charge generation, the input-end potential of the operational amplifier 112 rises, and at the same time, a potential with reverse polarity appears at the output end. However, because the amplifier's open-loop gain is sufficiently large, the output-end potential may work through the feedback loop so as to make the input-end potential zero instantaneously.

As a result, the signal charge pulses ($Q_{IN}$) are all integrated into the feedback capacitance (CF) and then output as voltage pulses (CSAOUT). At this point, since the feedback resistance (RF) for direct current is connected in parallel to the feedback capacitance (CF), the output becomes voltage pluses that slow discharge. Thus, the signal charge pulses are converted into voltage pulses.

The comparator 113 compares the voltage pulses output by the operational amplifier 112, a voltage threshold (VTH), and outputs the comparison result (COMP). In one example, the comparator 113 may serve to review the amplified pulse signal for a lower threshold (e.g., with pulse signals that are greater than this threshold being identified as representing photons). In another example, the comparator 113 may also discriminate the amplified pulse signal for an upper threshold for potentially discriminating out pulse signals that are too high.

In one example, only one counter may be used for one pixel. The counter 114 may be configured to operate on an input voltage or current to count photons that are passed through the comparator 113. The counter 114 counts the number of photons detected for the respective pixel based upon an output of the comparator.

The row driver 12 selects each row one at a time for readout. The pixel array may include any number of rows. The row driver 12 may extract and collect pixel data from each pixel within the selected row. The pixel data may include a number of photons for the respective pixel. In one example, the counter 114 may be a linear feedback shift register. The counter 114 may transmit pixel data in the column along a column output bus line 16 to a register 15, thereby producing serial (i.e., stream of) pixel data. In one example, the image sensor reads the data from the top to the bottom. Therefore, the row driver 12 can also read the pixel array from the top row to the bottom row.

In some examples, a control and timing circuit 13 may produce control signals and/or timing sequences to control pixel counting and pixel data readout. A column register 15 may store an entire row of pixel data. The data (shown as 'n bit Data' in FIG. 1) may then be shifted in sequences by a shift register 14 and sent to an outside integrated circuit or device. A shift register may temporarily store the pixel data from each row before the shift occurs.

Figure 3:
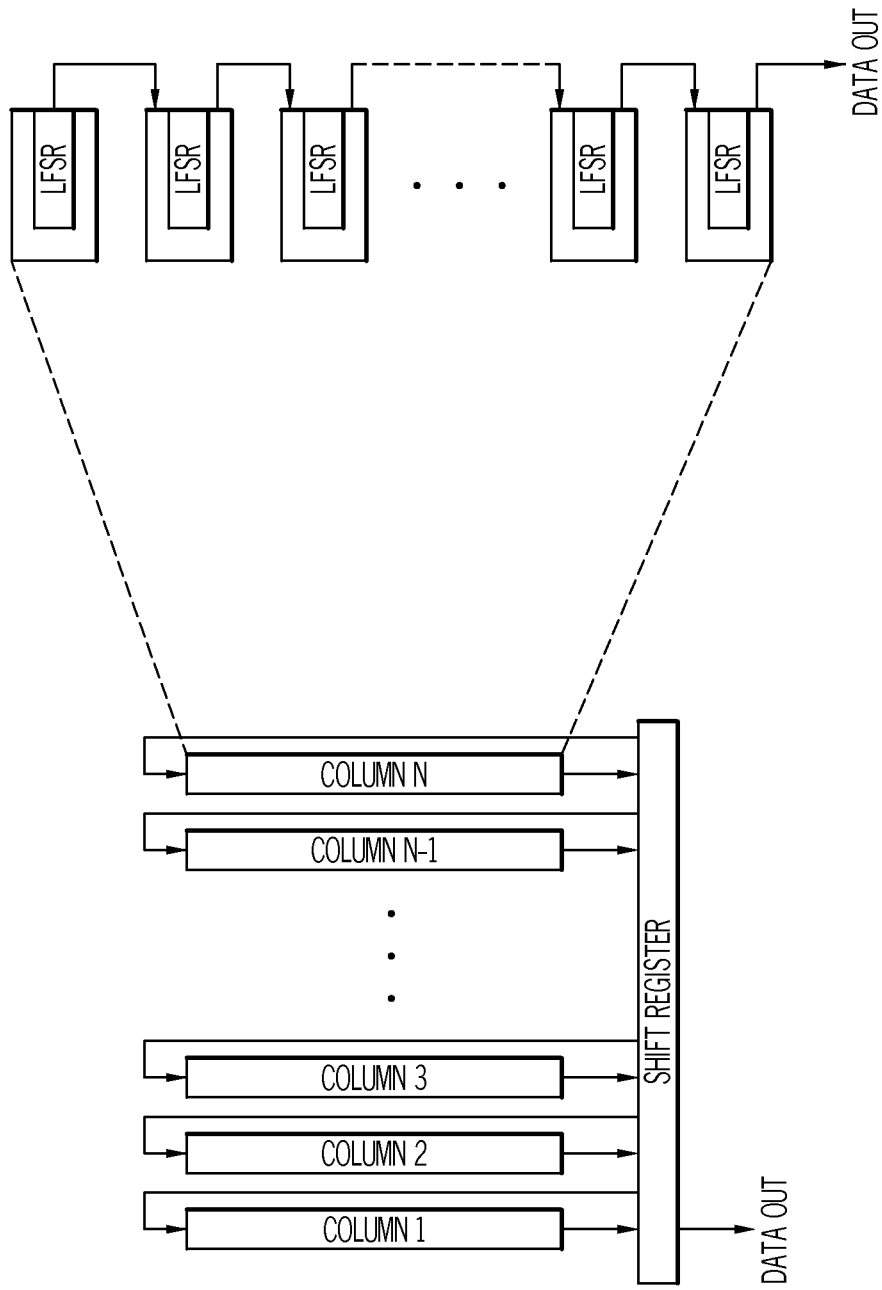
FIG. 3 shows an illustrative readout period of an X-ray ROIC component according to the current art.
Figure 4:
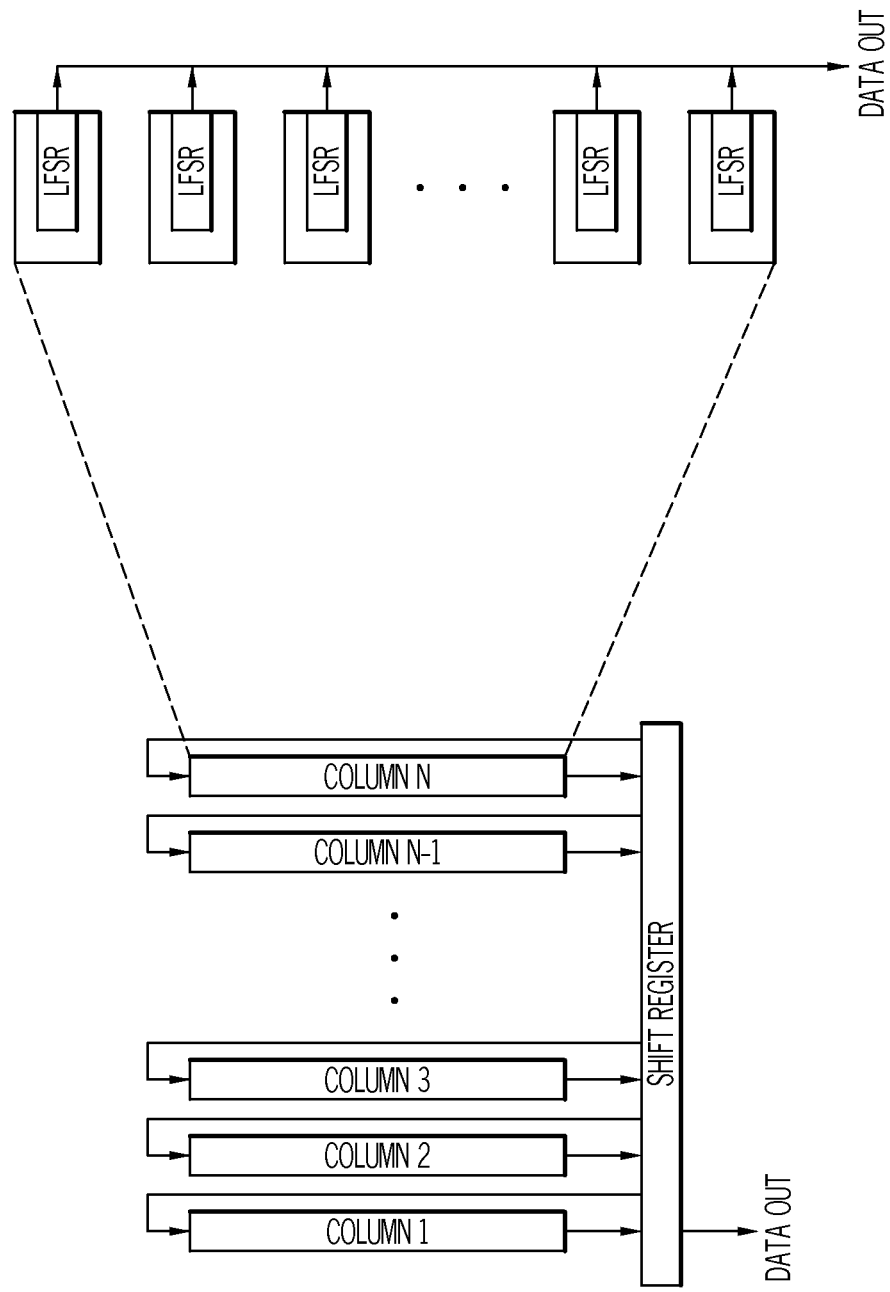
FIG. 4 shows an illustrative readout period of an X-ray ROIC component according to the present invention.

The process of photon counting by an X-ray ROIC has two periods: a counting period and a readout period. Current art methods repeat these two periods one after another, thus increasing the processing time. Furthermore, to increase the video quality of the X-ray more bits must be used which increases readout time. Another problem is pixel yield. If one or more pixels fail within a column, the data of the entire column may be lost because the data must go through all pixels within a respective column. FIG. 3 illustrates an example readout period of the current art. FIG. 4 illustrates an example readout period according to the present invention. The use of the shift register 14 and column bus line 16 allows for transmission of pixel data in high-speed.

Figure 5:
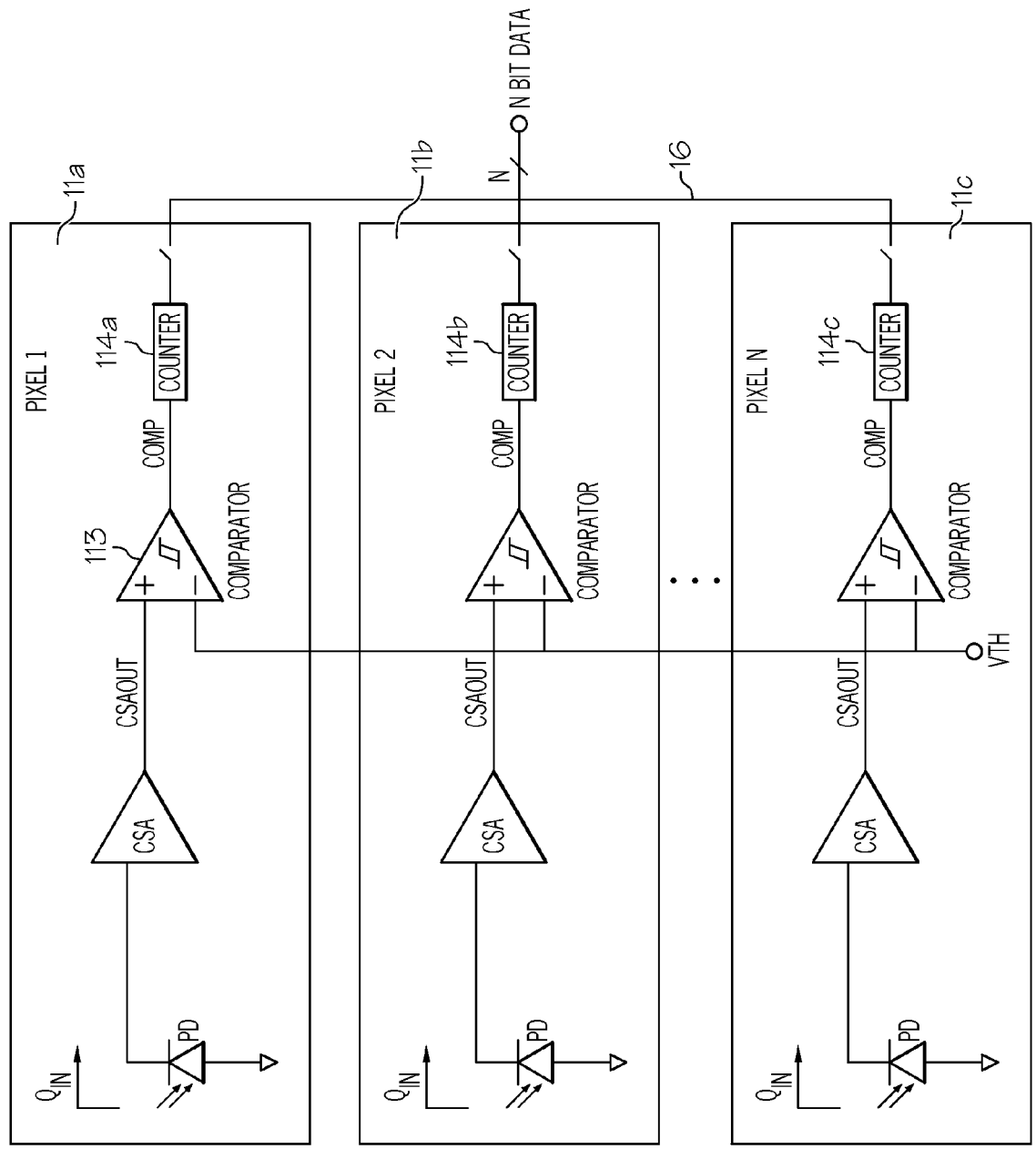
FIG. 5 shows a more detailed view of the pixel-to-pixel bus connection.

FIG. 5 shows a more detailed view of the pixel-to-pixel bus connection. The column bus line 16 is shown connection pixels 11a (Pixel1), 11b (Pixel2) and 11c (Pixel3). Pixel1 11a includes counter 114a. Pixel2 11b includes counter 114b. Pixel3 11c includes counter 114c. Any number of pixels may be connected via column bus line 16. The method of parallel data transmission reduces the transmit time by allowing for parallel readout. The data may be read by an outside reader in real-time. The data can be converted to an X-ray video display. The method allows for the viewing of X-ray video with less energy which translates into less X-ray radiation to patients without sacrificing video quality.

In addition to the above described embodiments, embodiments can also be implemented through computer readable code/instructions in/on a non-transitory medium, e.g., a computer readable medium, to control at least one processing device, such as a processor or computer, to implement any above described embodiment. The medium can correspond to any defined, measurable, and tangible structure permitting the storing and/or transmission of the computer readable code.

The media may also include, e.g., in combination with the computer readable code, data files, data structures, and the like. One or more embodiments of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Computer readable code may include both machine code, such as produced by a compiler, and files containing higher level code that may be executed by the computer using an interpreter, for example. The media may also be a distributed network, so that the computer readable code is stored and executed in a distributed fashion. Still further, as only an example, the processing element could include a processor or a computer processor, and processing elements may be distributed and/or included in a single device.

While aspects of the present invention has been particularly shown and described with reference to differing embodiments thereof, it should be understood that these embodiments should be considered in a descriptive sense only and not for purposes of limitation. Descriptions of features or aspects within each embodiment should typically be considered as available for other similar features or aspects in the remaining embodiments. Suitable results may equally be achieved if the described techniques are performed in a different order and/or if components in a described system, architecture, device, or circuit are combined in a different manner and/or replaced or supplemented by other components or their equivalents.

Thus, although a few embodiments have been shown and described, with additional embodiments being equally available, it would be appreciated by those skilled in the art that changes may be made in these embodiments without departing from the principles and spirit of the invention, the scope of which is defined in the claims and their equivalents.

What is claimed is:

1. A photon counting image sensor module configured to perform parallel mode readout of a pixel array, comprising:

a two-dimensional pixel array, wherein each pixel within the pixel array comprises a sensor configured to capture an electrical signal; an amplifier configured to convert the electrical signal into a voltage; a comparator configured to compare the voltage derived from the electric signal with a reference voltage to discriminate whether the electric signal from the sensor represents a photon detection; and a counter configured to count a photon detection for each respective pixel within the pixel array based upon an output of the comparator;

a plurality of column bus lines respectively connecting all pixels in each of the columns;

a vertical shift register having a plurality of parallel outputs for sequentially selecting said rows of pixels for readout over the column bus lines at a sensor output; and a column output bus line for transmitting a pixel data of a first pixel to an adjacent second pixel.

2. The photon counting image sensor module of claim 1, wherein at least one of the plurality of column bus lines is connected to the sensor output.

3. The photon counting image sensor module of claim 1, wherein all pixels in a row are selected for readout an additional plurality of times after an initial readout.

4. The photon counting image sensor module of claim 1, wherein the sensor comprises a photodiode.

5. The photon counting image sensor module of claim 1, wherein the counter is a linear feedback shift register.

6. The photon counting image sensor module of claim 1, further comprising a plurality of row lines respectively connecting all pixels in each of said rows.

7. The photon counting image sensor module of claim 1, further comprising a control and timing circuit configured to produce at least one of a control signal or timing sequence.

8. A computer-implemented method for parallel mode readout for an X-ray image sensor module having a pixel array, comprising:

capturing an electrical signal at each of a plurality of pixels within the pixel array;

converting each of the captured electrical signals into a respective voltage;

comparing each of the respective voltages with a reference voltage to discriminate whether the electric signal from the sensor represents a photon detection;

counting a photon detection for each of the plurality of pixels within the pixel array based upon an output of the comparator;

connecting all pixels in each of the columns;

sequentially selecting said rows of pixels for readout over the column bus lines at a sensor output; and transmitting a pixel data of a first pixel to an adjacent second pixel via a column output bus line.

9. The computer-implemented method of claim 8, wherein at least one of the plurality of column bus lines is connected to the sensor output.

10. The computer-implemented method of claim 8, further comprising selecting all pixels in a row for readout an additional plurality of times after an initial readout.

11. The computer-implemented method of claim 8, wherein the sensor comprises a photodiode.

12. The computer-implemented method of claim 8, wherein the counter is a linear feedback shift register.

13. The computer-implemented method of claim 8, further comprising respectively connecting all pixels in each of the rows via a row line.

14. A computer-readable storage device storing computer instructions which, when executed, enables a computer system to perform parallel mode readout for an X-ray image sensor module having a pixel array, the computer instructions comprising:

capturing an electrical signal at each of a plurality of pixels within the pixel array;

converting each of the captured electrical signals into a respective voltage;

comparing each of the respective voltages with a reference voltage to discriminate whether the electric signal from the sensor represents a photon detection;

counting a photon detection for each of the plurality of pixels within the pixel array based upon an output of the comparator;

connecting all pixels in each of the columns;

sequentially selecting said rows of pixels for readout over the column bus lines at a sensor output; and transmitting a pixel data of a first pixel to an adjacent second pixel via a column output bus line.

15. The computer-readable storage device of claim 14, wherein at least one of the plurality of column bus lines is connected to the sensor output.

16. The computer-readable storage device of claim 14, further comprising computer instructions for selecting all pixels in a row for readout an additional plurality of times after an initial readout.

17. The computer-readable storage device of claim 14, wherein the sensor comprises a photodiode.

18. The computer-readable storage device of claim 16, further comprising computer instructions for shifting a data associated with the all pixels in a row to one of an integrated circuit or device.

* * * * *